US006531416B1

United States Patent
Kobayashi et al.

(10) Patent No.: US 6,531,416 B1
(45) Date of Patent: Mar. 11, 2003

(54) METHOD FOR HEAT TREATMENT OF SILICON WAFER AND SILICON WAFER HEAT-TREATED BY THE METHOD

(75) Inventors: Norihiro Kobayashi, Gunma-ken (JP); Toshihiko Miyano, Gunma-ken (JP); Satoshi Oka, Gunma-ken (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/178,179

(22) Filed: Oct. 23, 1998

(30) Foreign Application Priority Data

Oct. 30, 1997 (JP) ................................ 9-314465

(51) Int. Cl.$^7$ ........................................ H01L 21/324
(52) U.S. Cl. ........................ 438/795; 438/4; 438/974
(58) Field of Search ............................ 438/795–800, 438/4, 974, FOR 407, FOR 434, FOR 450, FOR 457; 117/2, 13; 156/610

(56) References Cited

U.S. PATENT DOCUMENTS

| | | | |
|---|---|---|---|
| 4,231,809 A | * 11/1980 | Schmidt ................... | 148/1.5 |
| 4,617,066 A | * 10/1986 | Vasudev ................... | 148/1.5 |
| 4,780,174 A | * 10/1988 | Lan et al. ................. | 117/101 |
| 5,474,022 A | * 12/1995 | Abe et al. ................. | 117/214 |
| 5,667,584 A | * 9/1997 | Takano et al. ............ | 117/13 |
| 5,788,763 A | * 8/1998 | Hayashi et al. .......... | 117/2 |
| 5,885,905 A | * 3/1999 | Nadahara et al. ........ | 438/795 |
| 5,919,302 A | * 7/1999 | Falster et al. ............ | 117/3 |
| 5,935,320 A | * 8/1999 | Graef et al. .............. | 117/2 |
| 5,951,753 A | * 9/1999 | Dornberger et al. ..... | 117/3 |
| 5,966,625 A | * 10/1999 | Zhong et al. ............. | 438/492 |
| 5,979,188 A | * 11/1999 | Ojha ......................... | 65/386 |
| 6,027,562 A | * 2/2000 | Iida et al. ................. | 117/13 |

FOREIGN PATENT DOCUMENTS

| | | | |
|---|---|---|---|
| EP | 926718 | * 12/1998 | ......... H01L/21/324 |
| JP | 60247935 | 12/1985 | ......... H01L/21/324 |
| JP | 6295912 | 10/1994 | ......... H01L/21/322 |
| JP | 7161707 | 6/1995 | ......... H01L/21/316 |
| JP | 11-135514 | * 10/1997 | ......... H01L/21/324 |

OTHER PUBLICATIONS

The American Heritage® Dictionary of the English Language, Third Edition copyright © by Houghton Mifflin Company.*

Maddalon–Vinante C et al.; Influence of rapid thermal annealing and internal gettering on Czochralski–grown silicon. I. Oxygen Precipitation; Journal of Applied Physics, US, American Institute of Physics, New York; vol. 79, No. 5; Mar. 1, 1996; p. 2707–2711.

* cited by examiner

Primary Examiner—Wael Fahmy
Assistant Examiner—Marcos D. Pizarro-Crespo
(74) Attorney, Agent, or Firm—Hogan & Hartson, LLP

(57) ABSTRACT

A method for heat treatment of a silicon wafer in a reducing atmosphere through use of a rapid thermal annealer (RTA) is provided. In the method, the silicon wafer is heat-treated at a temperature of 1150° C. to 1300° C. for 1 sec to 60 sec in a mixture gas atmosphere of hydrogen and argon. Hydrogen is present in the mixture gas atmosphere in an amount of 10% to 80% by volume. Hydrogen is preferably present in the mixture gas atmosphere in an amount of 20% to 40% by volume. The method decreases COP density on the surface of the silicon wafer to thereby improve electrical characteristics, such as TZDB and TDDB, of the silicon wafer, suppresses the generation of slip dislocation to thereby prevent wafer breakage, and utilizes intrinsic advantages of the RTA, such as improvement in productivity and reduction in hydrogen gas usage.

2 Claims, 3 Drawing Sheets

METHOD FOR HEAT TREATMENT OF SILICON WAFER AND SILICON WAFER HEAT-TREATED BY THE METHOD

BACKGROUND OF THE INVENTION

1. Field of the Invention

The present invention relates to a method for the heat treatment of a silicon wafer, and particularly to a method for the heat treatment of a silicon wafer capable of reducing crystal originated particle (hereinafter referred to as COP) density on the surface of the silicon wafer and suppressing the generation of slip dislocation.

2. Description of the Related Art

In order to improve the electrical characteristics of a silicon wafer, such as time-zero dielectric-breakdown (hereinafter referred to as TZDB), a surface layer of the silicon wafer, on which devices are fabricated, must be free of defects. Crystal defects having a regular octahedral structure, called COPs, which are introduced into the silicon single-crystal during crystal growth, are present on the surface layer of the silicon wafer, so that the electrical characteristics of the silicon wafer are degraded.

In order to improve TZDB, hydrogen annealing is said to be effective in many reports (for example, Japanese Patent Publication (kokoku) No. 5-18254 and Japanese Patent Application Laid-Open (kokai) No. 6-295912). In hydrogen annealing, a silicon wafer is treated at high temperature for several hours in a hydrogen-gas atmosphere.

In order to improve the heat treatment performance; for example, to shorten the heat-treatment time, there is proposed a heat-treatment method using a rapid thermal annealer (hereinafter referred to as RTA). For example, Japanese Patent Application Laid-Open (kokai) No. 7-161707 proposes a method for improving TZDB through a heat treatment performed at a relatively low temperature of 950° C. to 1200° C. for a short time of 1 sec to 60 sec.

However, in the conventional heat treatment as disclosed in Japanese Patent Application Laid-Open No. 7-161707, heat treatment conditions are determined in view of TZDB. Also, in the embodiment described in the publication, although bulk micro defect (hereinafter referred to as BMD) density is taken into account, COPs present on the wafer surface is not considered. Such COPs directly affect electrical characteristics of devices.

The inventors of the present invention experimentally studied the above conventional heat treatment method and found that the conventional method somewhat improves TZDB, but fails to exhibit a satisfactory effect of improving COP density. In other words, the conventional heat treatment method is not very effective for improvement of electrical characteristics of a silicon wafer except for TZDB. Specifically, even when, for example, a silicon wafer is subjected to hydrogen annealing at 1050° C. for 30 sec as proposed in the conventional heat treatment method, COP density does not decrease, and in some case haze level indicative of surface roughness rather worsens due to etching of silicon by hydrogen. Also, hydrogen annealing even at 1100° C. is not satisfactorily effective for elimination of COPs. Thus, the conventional heat treatment conditions are not satisfactorily effective for an improvement of the COP density.

To cope with the above problems, the inventors of the present invention proposed, in Japanese Patent Application No. 9-92952, a method for the heat treatment of a silicon wafer in a reducing atmosphere using an RTA, particularly a method for the heat treatment of a silicon wafer capable of reducing COP density on the surface of the silicon wafer.

According to the proposed method, a silicon wafer is treated at a temperature of 1200° C. to the melting point of silicon for 1 sec to 60 sec in a reducing atmosphere. Preferably, the reducing atmosphere is a 100% hydrogen atmosphere or a mixture gas atmosphere of hydrogen and argon, and the heat treatment time is 1 sec to 30 sec.

It was proved that the proposed method significantly decreases the COP density on the silicon wafer surface and significantly improves the electrical characteristics, such as TZDB and time dependent dielectric breakdown (hereinafter referred to as TDDB). Also, the inventors of the present invention confirmed that even when a device-fabrication process includes an oxidizing heat-treatment, which tends to generate COPs on the wafer surface, COPs are less likely to be generated as compared to the case of a silicon wafer heat-treated by the conventional method. That is, the proposed method suppresses the generation of COPs and enables fabricated devices to retain good electrical characteristics. Further, use of an RTA prevents occurrence of oxygen precipitation, which would otherwise occur in heat treatment, and suppresses the occurrence of wafer warp.

As a result of subsequent studies on hydrogen annealing, the inventors of the present invention confirmed that the conditions of the heat treatment in a reducing atmosphere as described in Japanese Patent Application Laid-Open (kokai) No. 7-161707 not only fail to sufficiently decrease COP density but also cause a temperature difference in the wafer surface, a tendency peculiar to an RTA, resulting in a strong likelihood of generation of slip dislocations.

Also, it has been found that the conditions for the heat treatment in a reducing atmosphere as described in Japanese Patent Application No. 9-92952 significantly decreases COP density and thereby significantly improves electrical characteristics, such as TZDB and TDDB, of a silicon wafer; and that the heat treatment method of the publication, however, is not necessarily free from the generation of slip dislocation. That is, the heat treatment method can decrease COP density, but in some case causes the generation of slip dislocation.

Since a silicon wafer suffering the generation of slip dislocations breaks during a device-fabrication process and has an adverse effect on the electrical characteristics of fabricated devices, there must be created a method for the heat treatment of a silicon wafer which is not accompanied by the generation of slip dislocations.

SUMMARY OF THE INVENTION

The present invention has been accomplished to solve the above-mentioned problems, and an object of the invention is to provide a method for the heat treatment of a silicon wafer in a reducing atmosphere using an RTA, which method decreases COP density on the surface of the silicon wafer to thereby improve the electrical characteristics, such as TZDB and TDDB, of the silicon wafer, suppresses the generation of slip dislocations to thereby prevent wafer breakage, and utilizes intrinsic advantages of the RTA, such as improvement in productivity and reduction in hydrogen gas usage.

To achieve the above object, the present invention provides a method for the heat treatment of a silicon wafer, in which a silicon wafer is heat-treated in a reducing atmosphere through use of a rapid thermal annealer (RTA). In the method, the silicon wafer is heat-treated at a temperature of 1150° C. to 1300° C. for 1 sec to 60 sec in a reducing atmosphere, which is a mixture gas atmosphere of hydrogen and argon in which hydrogen is present in an amount of 10% to 80% by volume.

The rapid thermal annealing can be performed by a method in which a wafer is rapidly placed into a heat treatment furnace whose temperature is maintained within the above temperature range, and, immediately after the elapse of the above heat treatment time, the wafer is rapidly taken out from the furnace, or a method in which a silicon wafer is brought to a predetermined position within a heat treatment furnace and is then rapidly heated by a heater such as a lamp heater. The description "a wafer is rapidly placed into a heat treatment furnace and is rapidly taken out from the furnace after heat treatment" means that the wafer is placed into the heat treatment furnace and taken out from the furnace, without performing conventional control in which the temperature of a heat treatment furnace is increased and decreased over a predetermined time, or in which the silicon wafer is slowly loaded into and unloaded from the heat treatment furnace. Of course, transferring the wafer to a predetermined position within a furnace takes a certain time, which ranges from several seconds to several minutes depending on the capability of the wafer transfer apparatus.

As described above, a silicon wafer is heated through the use of an RTA in a reducing atmosphere composed of hydrogen (10% to 80% by volume) and inert argon gas at a temperature of 1150° C. to 1300° C. for a time of 1 sec to 60 sec. Therefore, the COP density of the silicon wafer can be significantly decreased, and generation of slip dislocation can be suppressed. Even when a slip dislocation is generated, the slip length (total length of generated slips) is short, so that there can be obtained silicon wafers containing an extremely small number of defects and excellent crystallinity without breakage.

Preferably, the mixture gas atmosphere of hydrogen and argon contains hydrogen in an amount of 20% to 40% by volume. Through employment of the hydrogen concentration range, generation of slip dislocation hardly occurs.

The present invention also provides a silicon wafer that has undergone the heat treatment of the invention. The thus-heat-treated silicon wafer has a COP density of, for example, not greater than 0.16 particles/cm$^2$ and no slip dislocation. Accordingly, devices manufactured from such a silicon wafer exhibit improved characteristics. Also, the yield of the device-fabrication process is improved.

In the present invention, a silicon wafer is heat-treated at a high temperature by use of an RTA such that the silicon wafer is heat-treated in the reducing mixture-gas atmosphere of hydrogen and argon in which hydrogen is present in an amount of 10% to 80% by volume. Therefore, the number of COPs on the surface layer of the wafer can be decreased greatly, without generation of slip dislocation and without roughening the surface of the wafer. As a result, there can be obtained a silicon wafer having excellent electrical characteristics, such as TZDB and TDDB, as well as excellent crystallinity. That is, even when COPs are introduced into a wafer due to introduction of COPs into monocrystalline silicon during growth thereof or due to heat treatment subsequent to the crystalline growth, the heat treatment of the invention eliminates thus-introduced COPs. Further, even when slip dislocation is generated during the heat treatment, the slip dislocation does not affect breakage of wafers, because the slip length is short.

Since the thus-heat-treated silicon wafer has few defects in the wafer surface, the wafer can be used as a particle monitor.

In contrast with the conventional batch-type heat-treatment, such as intrinsic-gettering heat-treatment, the heat treatment according to the present invention utilizes a single-wafer type RTA, so that oxygen precipitation does not occur during the heat treatment, a heat-treated wafer is free from warp and generation of slip dislocation, and a wafer can be heat-treated within a short period of time to thereby provide a mass-producing effect. Further, since the amount of hydrogen gas to be used can be decreased, safety is improved.

DESCRIPTION OF THE INVENTION AND PREFERRED EMBODIMENT

Figure 1:
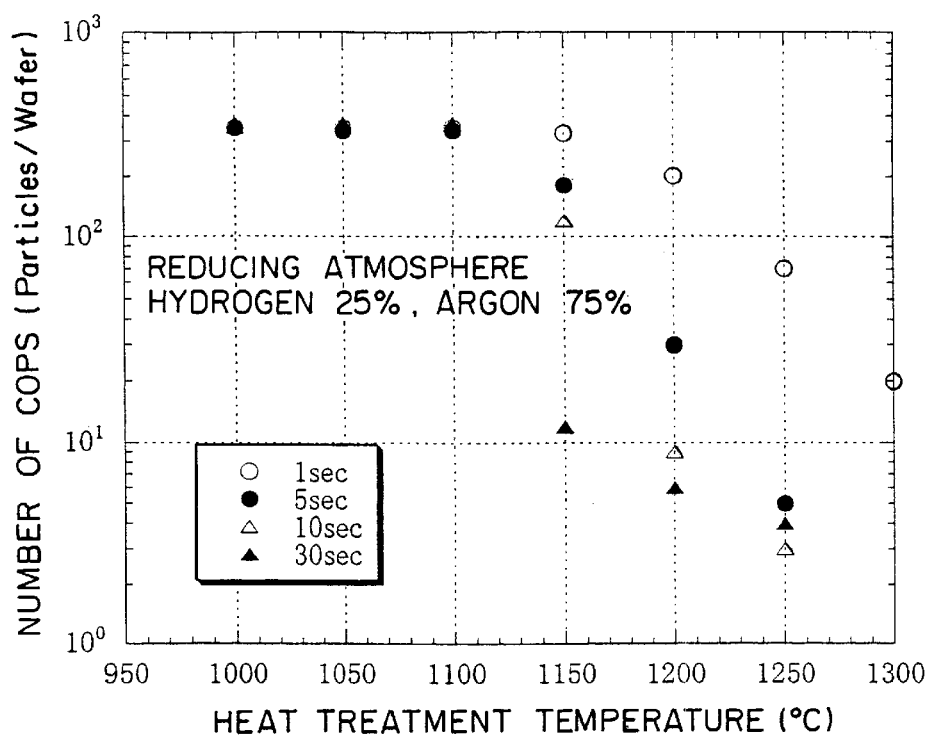
FIG. 1 is a graph showing the relationship among heat treatment temperature, heat treatment time, and the number of COPs as measured after heat treatment in heat treatment performed in a mixture gas atmosphere of hydrogen and argon through use of an RTA.

The present invention will next be described in detail.

The inventors of the present invention experimentally studied heat-treatment conditions for a silicon wafer in an attempt to obtain heat-treatment conditions capable of reducing COP density on the silicon wafer surface and reliably preventing generation of slip dislocation, and found that a silicon wafer having low COP density and no slip dislocation can be obtained through a heat treatment performed in a mixture gas atmosphere of hydrogen and argon whose hydrogen gas activity is slightly weakened, through addition of argon, as compared to that of an atmosphere used in the conventional heat treatment. Further, the present inventors investigates other conditions to complete the present invention.

First, the inventors of the present invention examined the cause of generation of slip dislocation in a silicon wafer under heat treatment. Through use of an RTA (SHS-2800, product of AST Corp.), the following experiment was conducted in an attempt to determine the appropriate heat treatment conditions.

Silicon wafers used for the experiment were obtained by the steps of: slicing, according to a conventional method, a silicon ingot produced by the Czochralski method; and mirror-polishing the sliced silicon wafers. The silicon wafers had a diameter of 8 inches and crystal orientation <100>.

Before undergoing the heat treatment, the silicon wafers were measured for COP density on their surfaces and were found to have a COP density of about 300 particles/wafer to 600 particles/wafer, an average COP density of about 500 particles/wafer. As practiced conventionally, COP density was measured through use of a particle counter (LS-6000, product of Hitachi Denshi Engineering Corp.). The particle counter was used at a 700V range. Particles having a size of 0.12 µm to 0.20 µm were counted.

With regard to slip dislocation, not only is generation of slip dislocation a problem, but also slip length has a significant effect on wafer breakage. Thus, the silicon wafers were checked for generation of slip dislocation and measured for slip length. The experimental study was carried out in an attempt to obtain heat treatment conditions under which generation of slip dislocation is suppressed, or under which, even when any slip dislocation is generated, slip length is suppressed to a degree such that the slip dislocation has no effect on the physical properties of wafers.

The above experimental study revealed that an RTA as used in the present invention is apt to cause a temperature difference on the wafer surface with a resultant likelihood of generation of slip dislocation. The experimental study also revealed that heat treatment performed in a 100% hydrogen atmosphere, which completely eliminates COPs, tends to cause generation of slip dislocation.

For example, when a silicon wafer is heat-treated at 1200° C. for 10 sec in a 100% hydrogen atmosphere, the heat-treated wafer suffers generation of slip dislocation at a high rate, and the length of the generated slip dislocation, if any, is long. Thus, heat treatment in the 100% hydrogen atmosphere causes instability in wafer quality. By contrast, in the case of heat treatment in a 100% argon atmosphere, which does not cause generation of slip dislocation, COPs are not eliminated satisfactorily, and also the wafer surface is roughened.

Thus, assuming that the composition of an atmosphere for heat treatment has a significant effect on generation of slip dislocation; the inventors of the present invention studied the composition of an atmosphere for heat treatment.

Silicon wafers were subjected to heat treatment in various atmospheres while heat treatment temperature and time were fixed to 1200° C. and 30 sec, respectively. The experiment revealed that no slip dislocation is generated in a wet (water vapor) atmosphere, an oxygen gas atmosphere, or an argon gas atmosphere. However, in the case of a 100% hydrogen atmosphere, slip dislocation is generated in a peripheral region of a wafer, and slip length is of such an extent as to cause wafer breakage.

In the above experiment, silicon wafers were heat-treated under fixed conditions, such as the same heat treatment sequence and the same gas flow rate, except that the composition of the atmosphere was varied. Nevertheless, silicon wafers heat-treated in a 100% hydrogen atmosphere suffered generation of slip dislocation. Thus, assuming that the activity of hydrogen gas is related to generation of slip dislocation, and the generation of slip dislocation can be prevented through weakening the activity of hydrogen, the inventors of the present invention thought of mixing hydrogen gas with a gas which does not cause generation of slip dislocation; particularly argon gas, which is inert, highly safe, and easy to handle, so as to obtain the optimum composition of an atmosphere for the heat treatment. In an attempt obtain the optimum atmospheric composition which would yield silicon wafers having decreased COP density and no slip dislocation and free of surface roughening, the inventors carried out the following experiment.

Figure 2:
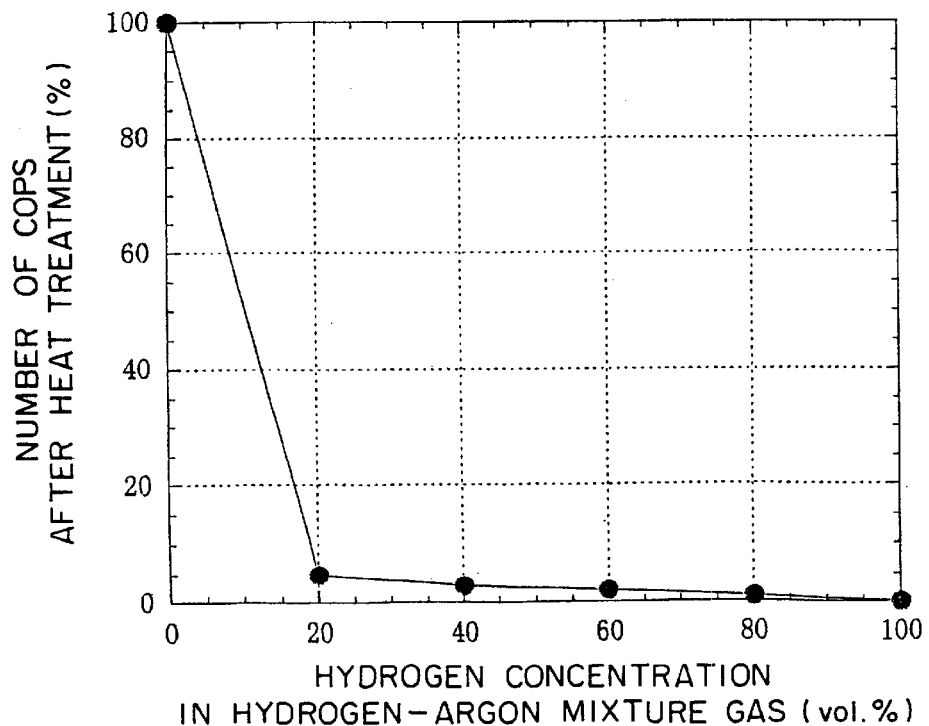
FIG. 2 is a graph showing the relationship between the hydrogen concentration in a hydrogen-argon mixture gas atmosphere and the number of COPs after heat treatment performed in the mixture gas atmosphere through use of the RTA.
Figure 3:
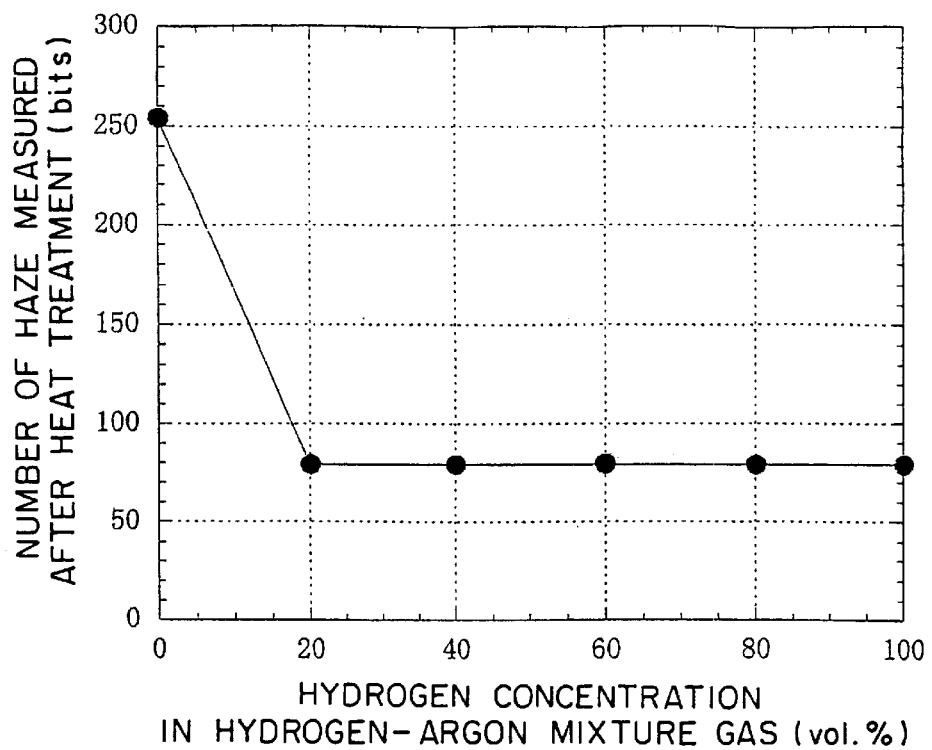
FIG. 3 is a graph showing the relationship between the hydrogen concentration in the hydrogen-argon mixture gas atmosphere and a haze level as measured after heat treatment.
Figure 4:
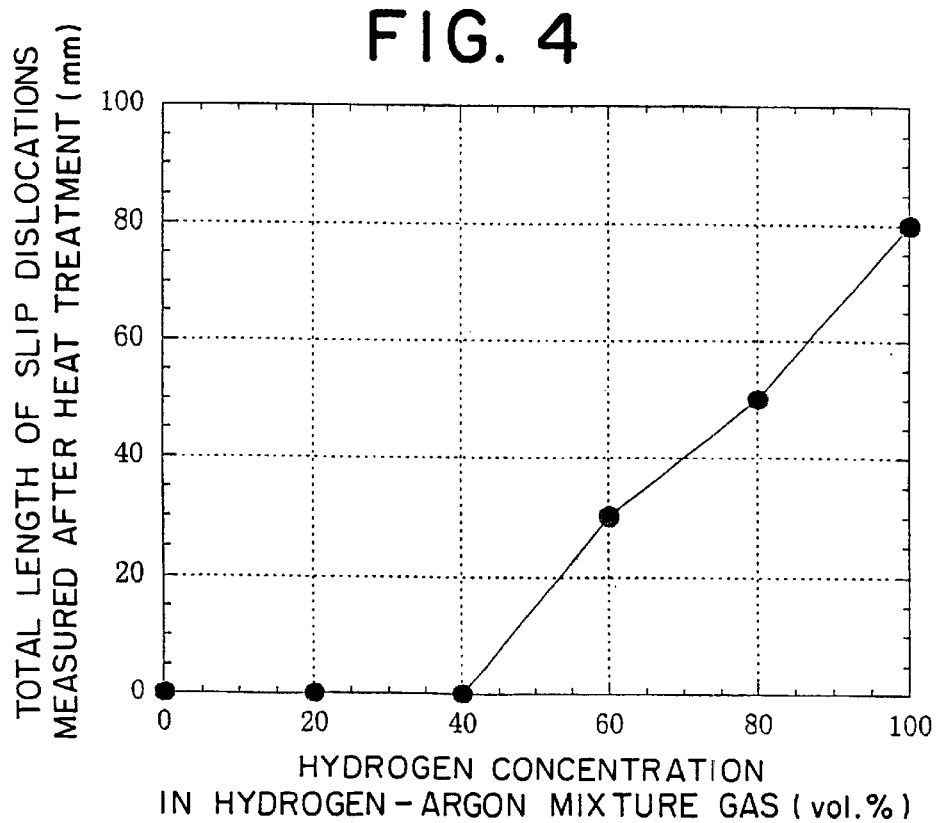
FIG. 4 is a graph showing the relationship between the hydrogen concentration in the hydrogen-argon mixture gas atmosphere and the total length of slip dislocations measured after heat treatment.

Silicon wafers were heat-treated at 1200° C. for 10 sec in a mixture gas atmosphere of argon and hydrogen whose hydrogen concentration was varied over a range of 10% to 100% by volume. The thus-heat-treated wafers were evaluated for COP density, haze, and generation of slip dislocation. The results are shown in FIGS. 2, 3, and 4.

Specifically, first, the heat-treated silicon wafers were examined for the decrease percentage of COP. The result is shown in FIG. 2. In FIG. 2, the horizontal axis represents hydrogen concentration, whereas the vertical axis represents the percentage decrease in COPs, or the ratio, expressed as a percentage, of COPs as measured after heat treatment to COPs as measured before heat treatment. As seen from FIG. 2, through heat treatment in a mixture gas atmosphere of argon and hydrogen whose hydrogen concentration is not less than 10%, particularly not less than 20%, COP density can be decreased to one-tenth its original value (to about 50 particles) and below. As the hydrogen concentration increases, COP density decreases, indicating the presence of hydrogen is effective for elimination of COPs.

Lower COP density is preferred; however, through attainment of a COP density not higher than 50 particles per 8-inch wafer, or not higher than 0.16 particles/cm$^2$, as specified in the present invention, electrical characteristics, such as TZDB and TDDB, of a silicon wafer are significantly improved.

Next, the heat-treated silicon wafers were examined for haze. The results are shown in FIG. 3. In FIG. 3, the horizontal axis represents hydrogen concentration, whereas the vertical axis represents the number of haze (bits). As seen from FIG. 3, at a hydrogen concentration of not less than 20%, haze is at an appropriate and stable level.

Haze is one kind of surface roughness and represents waviness of wafer surface having a period of several nanometers to tens of nanometers. Through use of a particle counter (LS-6000, product of Hitachi Denshi Engineering Corp.), the entire wafer surface was scanned with a laser beam to measure the intensity of irregular reflection from the surface. Through use of the thus-measured intensity, wafer surface roughness is quasi-quantitatively evaluated as a haze level of the entire wafer surface.

Finally, the heat-treated silicon wafers were examined for generation of slip dislocation. The results are shown in FIG. 4. In FIG. 4, the horizontal axis represents a mixture ratio of hydrogen, whereas the vertical axis represents the total length of generated slip dislocations. As seen from FIG. 4, no slip dislocation is observed at a hydrogen concentration of 0% to 40%. Even when slip dislocation is generated, slip length (a total length of generated slips) is not longer than about 50 mm at a hydrogen concentration of up to 80%, raising no practical problem. Generation of no slip dislocation is desirable; however, even when slip dislocation is generated, a slip length not longer than about 50 mm does not cause wafer breakage and is thus acceptable. However, at a hydrogen concentration in excess of 40%, slip length shows a definite tendency to increase with increasing the hydrogen concentration. Since a wafer becomes more apt to break as hydrogen concentration increases, silicon wafers are preferably heat-treated in a hydrogen atmosphere having a hydrogen concentration of not greater than 40%.

As mentioned previously, in hydrogen annealing, COP density can be effectively decreased through employment of a heat-treatment temperature higher than the conventional range of 950° C. to 1200° C., i.e., through employment of a temperature of 1200° C. to the melting point of silicon. In order to confirm an effect of a reducing mixture gas atmosphere on wafer characteristics, silicon wafers were heat-treated at a temperature of 1100° C. to 1300° C. while the composition of an atmospheric gas was varied. Heat treatment time was varied from 1 sec to 60 sec. A reducing atmosphere used for the experimental heat treatment was a mixture gas of hydrogen (25%) and argon (75%).

FIG. 1 shows the relationship between the number of COPs (particles per 8-inch wafer) as measured after heat treatment and heat treatment temperature. As seen from FIG. 1, COP density decreases significantly as heat treatment temperature increases beyond 1150° C. and as heat-treatment time increases beyond 1 sec. Under these heat-treatment conditions, no slip dislocation is observed, and haze level is as low as shown in FIG. 3.

The above-mentioned experimental findings are summarized below. When silicon wafers are to be heat-treated on single-wafer basis in a reducing atmosphere through use of an RTA, heat treatment conditions are desirably set as follows: heat treatment temperature: 1150° C. to 1300° C.; heat treatment time: 1 sec to 60 sec; and reducing atmosphere: a mixture gas atmosphere of hydrogen and argon having a hydrogen concentration of 10% to 80% by volume. Through heat treatment under these conditions, there can be obtained silicon wafers having COP density not greater than 10% of that measured before heat treatment, an acceptable haze level, and no slip dislocation or slip dislocation, if any, whose length is not longer than about 50 mm, which raises not practical problem. Preferably, the hydrogen concentration in a reducing atmosphere is 20% to 40% by volume. In this case, there can be obtained silicon wafers having no slip dislocation, a COP density not greater than 10% of that measured before heat treatment, and a good level of surface roughness.

An embodiment of the present invention will next be described with reference to the drawings. However, the present invention is not limited thereto.

In the present invention, an RTA is used for the heat treatment of silicon wafers. Examples of such an RTA include conventional heat-radiation type lamp-heaters and commercially available apparatus, such as SHS-2800, product of AST Corp. These apparatuses are neither very complex nor expensive.

Figure 5:
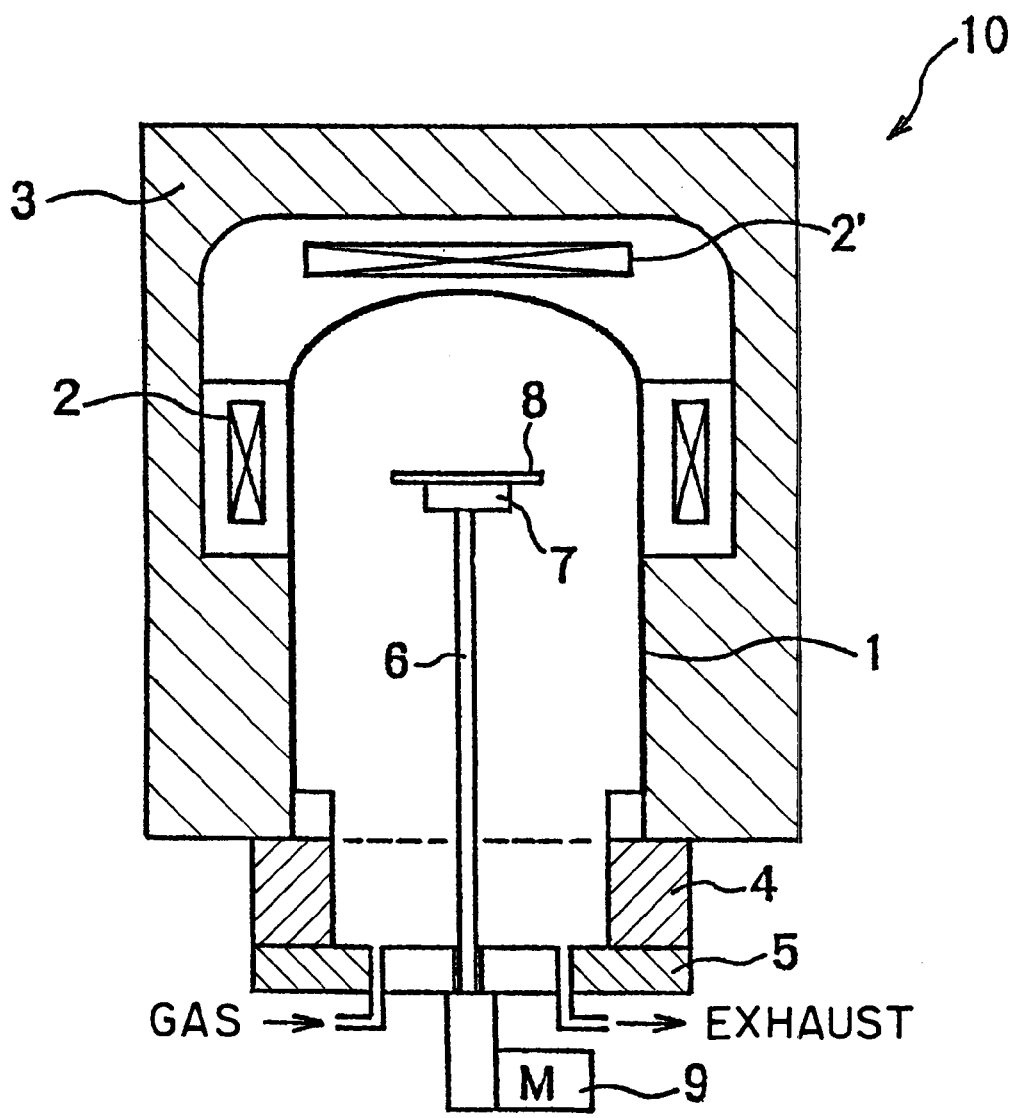
FIG. 5 is a schematic sectional view showing an exemplary RTA for carrying out a method of the present invention for heat treatment of silicon wafers.

FIG. 5 is a schematic sectional view showing an exemplary RTA for carrying out the method of the present invention for heat treatment of silicon wafers.

In FIG. 5, a heat treatment apparatus 10 includes a bell jar 1 made of, for example, silicon carbide or quartz. A silicon wafer is heat-treated within the bell jar 1. Heaters 2 and 2' are arranged so as to enclose the bell jar 1 and used to heat a silicon wafer. The upper heater 2' is separated from the lower heater 2, so that power supplied to the upper heater 2' can be controlled independently of power supplied to the lower heater 2. Of course, a heating system is not limited thereto. Radiation heating or radio-frequency induction heating may be employed. A housing 3 is disposed outside the heaters 2 and 2' so as to serve as a thermal shield.

A water-cooled chamber 4 and a base plate 5 are disposed underneath the bell jar 1, to thereby isolate the interior of the bell jar 1 from the atmosphere. A wafer 8 is held on a stage 7. The stage 7 is attached to the top end of a support shaft 6, which is driven by a motor 9 to move vertically. The water-cooled chamber 4 has an unillustrated wafer inlet/outlet port formed therein so that a wafer can be horizontally loaded into or unloaded from the water-cooled chamber 4. The wafer inlet/outlet port is closed or opened by a gate valve. The base plate 5 has a gas inlet and an exhaust outlet so as to enable adjustment of a gas atmosphere within the bell jar 1.

Through use of the above heat treatment apparatus 10, a silicon wafer is thermally annealed in the following manner.

First, the interior of the bell jar 1 is heated to a desired temperature, for example, a temperature of 1150° C. to 1300° C. by the heaters 2 and 2' and held at the temperature. Through independent control of power supplied to the separate heaters 2 and 2', a desired temperature distribution can be established within the bell jar 1 along the direction of height of the bell jar 1. Accordingly, heat treatment temperature for a wafer can be determined by means of the position of the stage 7, or the amount of insertion of the support shaft 6 into the bell jar 1.

When the interior of the bell jar 1 is maintained at a desired temperature, a silicon wafer is loaded into the water-cooled chamber 4 through the wafer inlet/outlet port formed in the water-cooled chamber 4 through use of an unillustrated wafer handling apparatus located adjacent to the heat treatment apparatus 10. The thus-loaded silicon wafer is placed on the stage 7, which stands by at the lowest position of its vertical movement stroke, via, for example, an SiC boat. Since the water-cooled chamber 4 and the base plate 5 are water-cooled, the silicon wafer situated within the water-cooled chamber 4 is not heated to high temperature.

When placing the silicon wafer on the stage 7 is completed, the support shaft 6 is immediately driven by the motor 9 and inserted into the bell jar 1 so as to raise the stage 7 to a position corresponding to a desired temperature of 1150° C. to 1300° C., thereby subjecting the silicon wafer placed on the stage 7 to high-temperature heat treatment. In this case, the silicon wafer is moved in, for example, only about 20 seconds, from the lowest standby position of the stage 7 located within the water-cooled chamber 4 to a position corresponding to the desired temperature. Thus, the silicon wafer is rapidly heated.

Then, the stage 7 is held stationary at the position corresponding to the desired temperature for a predetermined time (1 sec to 60 sec), thereby subjecting the silicon wafer to high-temperature heat treatment for the time. After the elapse of the predetermined time to complete the high-temperature heat treatment, the support shaft 6 is immediately driven by the motor 9 and withdrawn from the bell jar 1, thereby lowering the stage 7 to the lowest standby position located within the water-cooled chamber 4. This lowering motion can also be completed in, for example, about 20 sec. Thus, the silicon wafer on the stage 7 is rapidly cooled since the water-cooled chamber 4 and the base plate 5 are water-cooled. Finally, the silicon wafer is unloaded from the water-cooled chamber 4 through use of the wafer handling apparatus, thereby completing the heat treatment.

When there are more silicon wafers to be heat-treated, since the heat treatment apparatus 10 is held at the heat treatment temperature, the wafers may be loaded, one by one, into the heat treatment apparatus 10 to continuously undergo the heat treatment.

EXAMPLES

The present invention will next be described by way of example, which should not be construed as limiting the invention.

Example

The heat treatment method of the present invention was carried out through use of silicon wafers which were sliced from a silicon ingot grown by the CZ method and had orientation <100> and a diameter of 8 inches. Through use of the RTA, SHS-2800 (product of AST Corp.), the wafers were subjected to rapid thermal annealing at 1200° C. for 10 sec in a mixture gas atmosphere of hydrogen (25% by volume) and argon (75% by volume).

Before being subjected to the heat treatment, the silicon wafers were measured for COP density and found to have an average COP density of about 500 particles/wafer.

As a result of the heat treatment, the COP density was decreased to about 25 particles/wafer. Also, no slip dislocation was observed with the heat-treated wafers.

Comparative Example 1

The silicon wafers were heat-treated under conditions similar to those of the Example, except that the heat treatment was performed in a 100% hydrogen gas atmosphere. As a result, the COP density was decreased to about 10 particles/wafer. However, the generation of slip dislocation was observed with all of the heat-treated wafers. Particularly, some wafers suffered two long slips, each having a length of about 40 mm (a total slip length of about 80 mm). Also, some wafers suffered the generation of a slip extending to a surface on which devices are to be formed. Wafers suffering such slip dislocation break easily.

Comparative Example 2

The silicon wafers were heat-treated under conditions similar to those of the Example, except that the heat treatment was performed in a 100% argon gas atmosphere. As a result, the generation of slip dislocation was not observed; however, haze indicative of roughened surface was observed, and COP density was not decreased.

The present invention is not limited to the above-described embodiment. The above-described embodiment is a mere example, and those having the substantially same structure as that described in the appended claims and providing the similar action and effects are included in the scope of the present invention.

For example, the above-described embodiment uses the heat treatment apparatus 10 as shown in FIG. 5. However, an apparatus for carrying out the invention is not limited thereto. Any kind of heat treatment apparatus may be used so long as the apparatus can rapidly anneal a silicon wafer and can heat a silicon wafer at a temperature of 1150° C. or higher.

The heat treatment method of the present invention may be applied to pretreatment for an epitaxial growth process, which is similar to the above-described heat treatment.

The above-described embodiment is described while mentioning a heat treatment of a silicon wafer having a diameter of 8 inches. However, the present invention is not limited thereto, but is applicable to a silicon wafer having any diameter, for example, 10 to 16 inches or even larger.

What is claimed is:

1. A method for heat treatment of a silicon wafer in a reducing atmosphere by use of a rapid thermal annealer, wherein the silicon wafer is heat treated at a temperature of 1150° C. to 1300° C. for 1 sec to 60 sec in a mixture gas atmosphere of hydrogen and argon, hydrogen being present in the mixture gas atmosphere in an amount of 20% to 80% by volume.

2. A method for heat treatment of a silicon wafer according to claim 1, wherein hydrogen is present in the mixture gas atmosphere of hydrogen and argon in an amount of 20% to 40% by volume.

* * * * *